US012626642B2

(12) United States Patent
Jeong et al.

(10) Patent No.: US 12,626,642 B2
(45) Date of Patent: May 12, 2026

(54) DISPLAY APPARATUS HAVING REDUCED NON-DISPLAY REGION

(71) Applicant: Samsung Display Co., Ltd., Yongin-Si (KR)

(72) Inventors: Min-Jae Jeong, Hwaseong-si (KR); Jae-Yong Jang, Seoul (KR); Gyung-Soon Park, Seoul (KR); Kyung-Hoon Chung, Yongin-si (KR); Chong-Chul Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/628,892

(22) Filed: Apr. 8, 2024

(65) Prior Publication Data

US 2024/0260441 A1 Aug. 1, 2024

Related U.S. Application Data

(63) Continuation of application No. 17/290,732, filed as application No. PCT/KR2019/012423 on Sep. 24, 2019, now Pat. No. 11,957,034.

(30) Foreign Application Priority Data

Oct. 30, 2018 (KR) ........................ 10-2018-0130766

(51) Int. Cl.
  *H01L 27/32* (2006.01)
  *G09G 3/32* (2016.01)
  (Continued)

(52) U.S. Cl.
  CPC ............. *G09G 3/32* (2013.01); *H10K 59/126* (2023.02); *H10K 59/131* (2023.02); *H10K 59/88* (2023.02)

(58) Field of Classification Search
  CPC .... H10K 59/88; H10K 59/126; H10K 59/131; H10K 59/00; H10K 59/82;
  (Continued)

(56) References Cited

U.S. PATENT DOCUMENTS 10,270,059 B2 4/2019 Kim
10,347,187 B2 7/2019 An et al.
  (Continued)

FOREIGN PATENT DOCUMENTS

CN 108254984 A 7/2018
EP 3716002 A1 9/2020
  (Continued)

OTHER PUBLICATIONS

Korean Notice of Allowance corresponding to Application No. 10-2018-0130766 and issued on Apr. 11, 2023, 7 pages.

*Primary Examiner* — Ermias T Woldegeorgis
(74) *Attorney, Agent, or Firm* — Innovation Counsel LLP

(57) ABSTRACT

A display apparatus includes a base substrate including a display region and a peripheral region that is a non-display region surrounding the display region, a plurality of data lines disposed in the display region on the base substrate and extending to the peripheral region, a bypass data line disposed in the display region and the peripheral region on the base substrate and electrically connected to at least one of the data lines, and a dummy pattern spaced apart from the bypass data line and disposed on a same layer as the bypass data line.

20 Claims, 12 Drawing Sheets

(51) Int. Cl.
    *H10K 59/126*        (2023.01)
    *H10K 59/131*        (2023.01)
    *H10K 59/88*         (2023.01)

(58) Field of Classification Search
    CPC ....... G09G 2320/0209; G09G 2330/06; G09G
                    3/2092; G09G 2300/0413; G09G
                    2300/0426; G09G 3/32; G09G 3/3275
    See application file for complete search history.

(56)                    References Cited

U.S. PATENT DOCUMENTS

| | | | |
|---|---|---|---|
| 10,691,241 | B2 | 6/2020 | Kim et al. |
| 11,158,267 | B2 | 10/2021 | Jeong et al. |
| 11,386,851 | B2 | 7/2022 | Park et al. |
| 12,035,595 | B2 | 7/2024 | Cho et al. |
| 2015/0060809 | A1 | 3/2015 | Kim et al. |
| 2015/0255523 | A1 | 9/2015 | Her |
| 2015/0277635 | A1* | 10/2015 | Kim ........................ G06F 3/047 |
| | | | 345/173 |
| 2018/0204895 | A1 | 7/2018 | Lin et al. |
| 2018/0308903 | A1 | 10/2018 | Jeong et al. |
| 2019/0237487 | A1 | 8/2019 | Zhang et al. |

| | | | |
|---|---|---|---|
| 2019/0278145 | A1 | 9/2019 | Tanaka et al. |
| 2021/0296424 | A1 | 9/2021 | Cho et al. |
| 2022/0005886 | A1 | 1/2022 | Jeong et al. |
| 2022/0037447 | A1 | 2/2022 | Cho et al. |

FOREIGN PATENT DOCUMENTS

| | | | |
|---|---|---|---|
| EP | 3751388 | A1 | 12/2020 |
| EP | 3813137 | A1 | 4/2021 |
| EP | 3832728 | A1 | 6/2021 |
| EP | 3852146 | A1 | 7/2021 |
| KR | 10-2005-0051504 | A | 6/2005 |
| KR | 10-1290078 | B1 | 7/2013 |
| KR | 10-2014-0140484 | A | 12/2014 |
| KR | 10-2015-0025902 | A | 3/2015 |
| KR | 10-2015-0105586 | A | 9/2015 |
| KR | 10-2017-0024200 | A | 3/2017 |
| KR | 10-2017-0073483 | A | 6/2017 |
| KR | 10-2017-0077780 | A | 7/2017 |
| KR | 10-2017-0080223 | A | 7/2017 |
| KR | 10-2017-0143066 | A | 12/2017 |
| KR | 10-2018-0032262 | A | 3/2018 |
| KR | 10-2019-0083392 | A | 7/2019 |
| KR | 10-2555841 | B1 | 7/2023 |
| WO | 2018-062023 | A1 | 4/2018 |

* cited by examiner

500

500

DISPLAY APPARATUS HAVING REDUCED NON-DISPLAY REGION

CROSS-REFERENCE TO RELATED APPLICATIONS

This application is a continuation application of U.S. patent application Ser. No. 17/290,732 filed on Apr. 30, 2021, which claims priority from PCT/KR2019/012423 filed on Sep. 24, 2019, which in turn claims priority from Korean Patent Application No. 10-2018-0130766 filed on Oct. 30, 2018. All the above patent applications are incorporated by reference.

TECHNICAL FIELD

The present disclosure relates to a display apparatus. More particularly, the present disclosure relates to a display apparatus having an improved display quality by reducing wire stains.

BACKGROUND

In recent years, owing to advancement of technology, display products with high performance are being produced as the display products become smaller and lighter. Until now, a cathode ray tube (CRT) television has been widely used as a display apparatus because the CRT television has many advantages in terms of performance and price. Recently, however, a display apparatus such as a plasma display apparatus, a liquid crystal display apparatus, an organic light emitting display apparatus, and the like, are attracting attention by offering advantages over the CRT television in size, portability, weight reduction, low power consumption, and the like.

The display apparatus includes a display region in which an image is displayed and a peripheral region that is a non-display region around the display region. Along with increasing demands for a display apparatus in which the peripheral region is reduced (e.g., a bezel-less display apparatus, an infinity display apparatus, and the like), there have been efforts to implement a display apparatus of various shapes such as rounded corners of the display region. In addition, the display apparatus includes a signal line and a thin film transistor, and there are problems in which a unique arrangement of the signal line is visible to a user (or viewer) as a "stain."

SUMMARY

The present disclosure provides a display apparatus having an improved display quality and a reduced peripheral region (i.e., a non-display region).

According to an aspect of embodiments, a display apparatus may include a base substrate including a display region and a peripheral region that is a non-display region surrounding the display region, a plurality of data lines disposed in the display region on the base substrate and extending to the peripheral region, a bypass data line disposed in the display region and the peripheral region on the base substrate and electrically connected to at least one of the data lines, and a dummy pattern spaced apart from the bypass data line and disposed on a same layer as the bypass data line.

In embodiments, a constant voltage may be applied to the dummy pattern.

In embodiments, the display apparatus may further include a first via insulating layer disposed between the data line and the bypass data line, a second via insulating layer disposed on the first via insulating layer on which the bypass data line and the dummy pattern are disposed, a first electrode disposed on the second via insulating layer, a light emitting layer disposed on the first electrode, and a second electrode disposed on the light emitting layer.

In embodiments, the display apparatus may further include a first power line disposed between the base substrate and the first via insulating layer, a first power voltage being applied to the first power line. In addition, the first power line may be disposed to overlap the bypass data line or the dummy pattern.

In embodiments, the bypass data line and the data line may contact each other via a contact hole that is formed through the first via insulating layer in the peripheral region.

In embodiments, the second via insulating layer may include an organic insulating material.

In embodiments, a step difference corresponding to the dummy pattern and the bypass data line may be formed on an upper surface of the second via insulating layer on the dummy pattern and the bypass data line.

In embodiments, at least a portion of the first electrode overlaps the dummy pattern or the bypass data line, and a step difference corresponding to the step difference may be formed in the first electrode.

In embodiments, the first electrode may include silver (Ag).

In embodiments, the bypass data line may include a vertical part and a horizontal part connected to the vertical part, the dummy pattern may include a plurality of vertical dummy parts and a plurality of horizontal dummy parts, at least one of the vertical dummy parts extends in the same direction as the vertical part of the bypass data line, and at least one of the horizontal dummy parts extends in the same direction as the horizontal part of the bypass data line.

In embodiments, the dummy pattern may include a plurality of vertical dummy parts and a plurality of horizontal dummy parts, and the vertical dummy part and the horizontal dummy part may be connected to each other to form a mesh structure.

In embodiments, the data line may include an (n)th data line and an (n+1)th data line, the bypass data line may include an (n)th bypass data line electrically connected to the (n)th data line and an (n+1)th bypass data line electrically connected to the (n+1)th data line, and the dummy pattern may be disposed between the (n)th bypass data line and the (n+1)th bypass data line.

In embodiments, the display region may have a quadrangle shape with rounded corners, the peripheral region may include a pad region in which a pad part is disposed, the data lines may include a first data line disposed adjacent to the rounded corners and a second data line spaced apart from the first data line, the first data line may be electrically connected to the pad part through the bypass data line, and the second data line may be connected to the pad part without connecting to the bypass data line.

In embodiments, the display apparatus may further include a thin film transistor disposed on the base substrate and a shielding electrode physically connected to the dummy pattern and disposed to overlap the thin film transistor.

In embodiments, the peripheral region of the base substrate may further include a pad region in which a pad part is disposed and a folding region that is folded to place the pad region on a rear surface of the display apparatus.

According to another aspect of embodiments, a display apparatus may include a base substrate, a thin film transistor disposed on the base substrate, an interlayer insulating layer disposed on the base substrate, a first data line, a first power line adjacent to the first data line, a second data line, and a second power line adjacent to the second data line that are disposed on the interlayer insulating layer, a first via insulating layer disposed on the first data line, the first power line, the second data line, and the second power line, a first bypass data line and a dummy pattern that are disposed on the first via insulating layer and electrically connected to the first data line, and a second via insulating layer disposed on the first bypass data line and the dummy pattern and having a step difference on an upper surface of the second via insulating layer along a profile of the first bypass data line and the dummy pattern.

In embodiments, the display apparatus may further include a first electrode disposed on the second via insulating layer, a light emitting layer disposed on the first electrode, and a second electrode disposed on the light emitting layer.

In embodiments, the first electrode may overlap the first bypass data line or the dummy pattern.

In embodiments, a constant voltage may be applied to the dummy pattern.

In embodiments, the second via insulating layer may include an organic insulating material.

DETAILED DESCRIPTION

Hereinafter, embodiments will be explained in detail with reference to the accompanying drawings.

Figure 1:
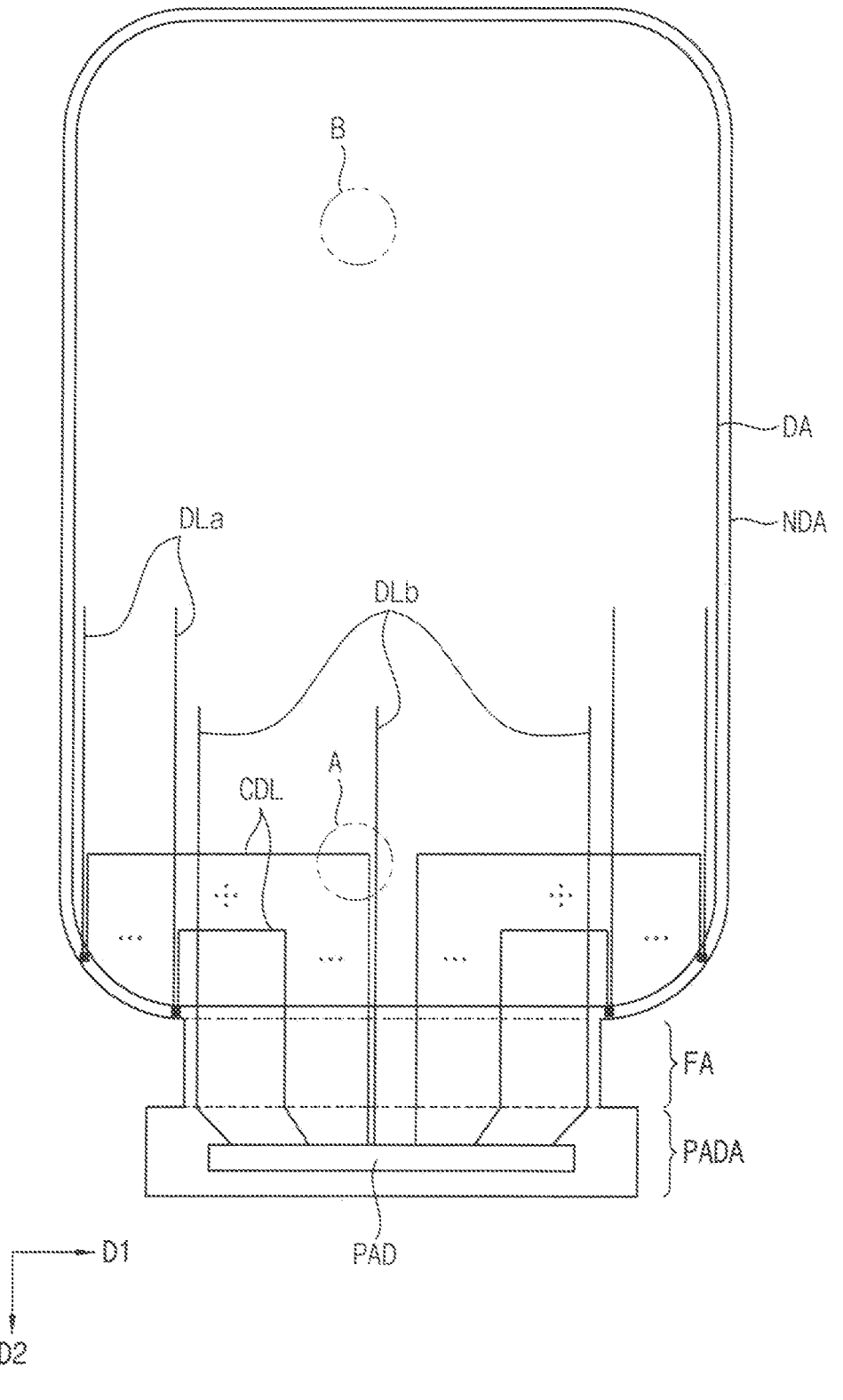
FIG. 1 is a plan view illustrating a display apparatus according to embodiments.

FIG. 1 is a plan view illustrating a display apparatus according to embodiments.

Referring to FIG. 1, the display apparatus may include a display region DA on which an image is displayed and a peripheral region NDA that is a non-display region surrounding the display region DA and adjacent to the display region DA.

The peripheral region NDA may include a pad region PADA in which a pad part PAD is disposed and a folding region FA that is folded to place the pad region PADA on a rear surface of the display apparatus.

The display region DA may be formed in a rectangular shape with rounded corners on a plane formed in a first direction D1 and a second direction D2 perpendicular to the first direction D1. The display apparatus may include a plurality of pixels disposed in the display region DA, disposed in a matrix form to display an image, and including a thin film transistor, a plurality of data lines DLa and DLb electrically connected to the pixels, and a plurality of scan lines crossing the data lines DLa and DLb. In addition, the display apparatus may further include a plurality of bypass data lines CDL disposed in the display region DA and electrically connected to the data lines DLa.

The data lines DLa and DLb may extend in the second direction D2 and may be arranged in the first direction D1. The scan lines may extend in the first direction D1 and may cross the data lines DL.

The peripheral region NDA may be a non-display region. The peripheral region NDA may be adjacent to the display region DA and may surround an edge of the display region DA. A circuit structure for driving the pixels in the display region DA may be formed in the peripheral region NDA.

The data lines DLa disposed on a left side or a right side of the display apparatus may be electrically connected (i.e., contacted) to the bypass data line CDL via a contact hole CNT formed in the peripheral region NDA. That is, the bypass data line CDL and the data line DLa connected to the pixels disposed on the left side or the right side of the display apparatus may extend across the display region DA and the peripheral region NDA, and an end of the bypass data line CDL and an end of the data line DLa may be connected to each other via the contact hole CNT formed in the peripheral region NDA. The bypass data line CDL may extend from the contact hole CNT and may overlap the data lines DL in the display region DA, such that the bypass data line CDL may be connected to the pad part PAD of the pad region PADA of the peripheral region NDA.

Meanwhile, the data lines DLb disposed at a center of the display apparatus may extend in the second direction D2 and may be electrically connected to the pad part PAD. That is, the data lines DLb may be electrically connected to the pad part PAD without connecting to the bypass data line CDL.

A driving circuit chip (not shown) may be mounted on the pad part PAD, or an external driving part substrate may be connected to the pad part PAD. Although not shown in detail, the pad part PAD may include a plurality of terminals electrically connected to each of the data lines DLa and DLb.

According to embodiments, the data lines DLa disposed to correspond to the rounded corners of the left side and the right side of the display region DA of the display apparatus may be connected to the pad part PAD through the bypass data line CDL. Thus, there is no separate spider line in the peripheral region NDA adjacent to the rounded corners of the left side and the right side, such that a width of the peripheral region NDA may be narrowed.

In addition, since the folding region FA is folded and the pad region PADA is disposed (i.e., overlapped) on the rear surface of the display region DA, the display apparatus in which a bezel, which is a non-display region, is minimized may be achieved.

Figure 2:
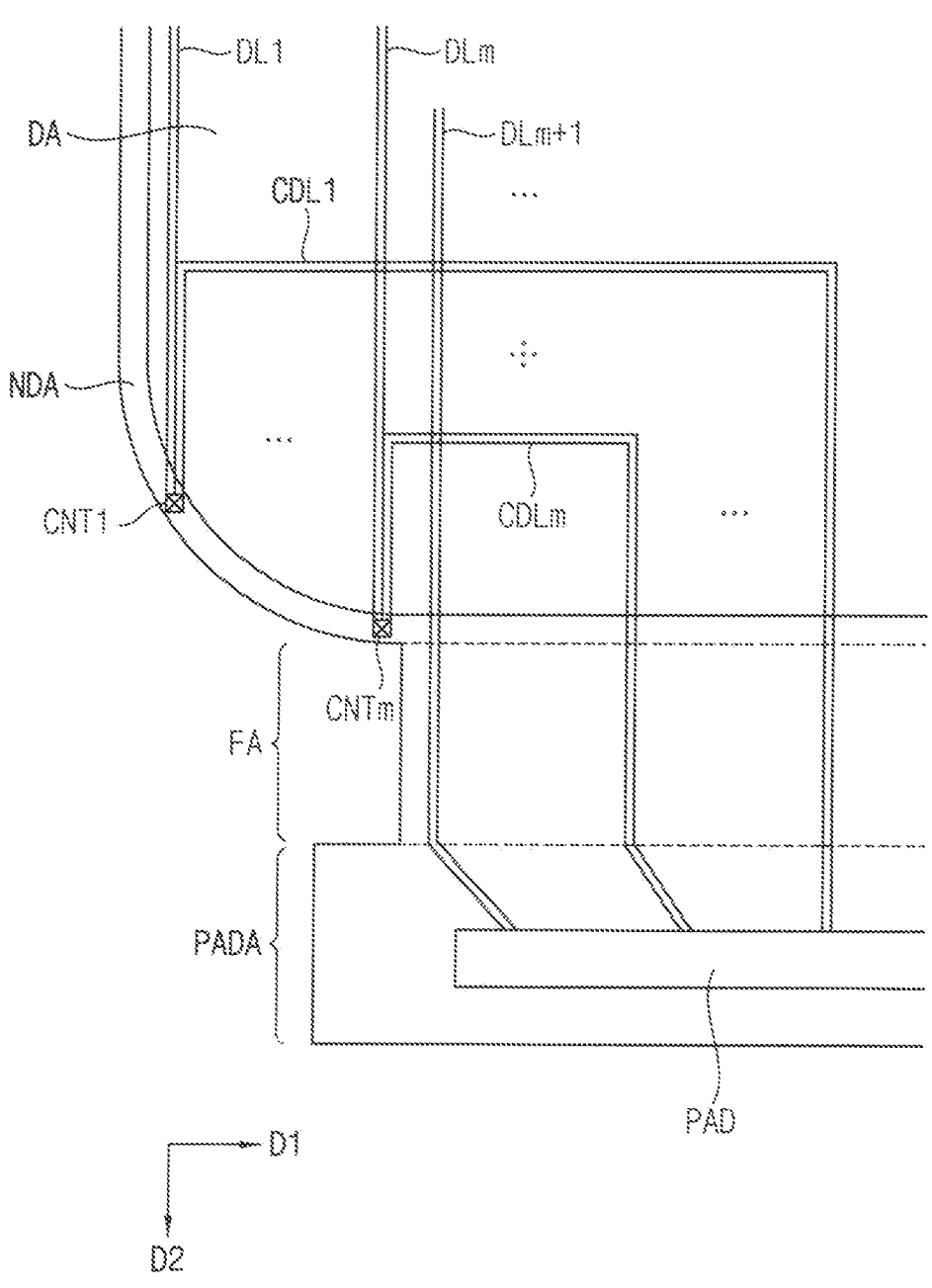
FIG. 2 is an enlarged view illustrating a lower left portion of the display apparatus of FIG. 1.

FIG. 2 is an enlarged view illustrating a lower left portion of the display apparatus of FIG. 1.

Referring to FIGS. 1 and 2, the data lines DLa and DLb may include a first data line DL1, an (m)th data line DLm, and an (m+1)th data line DLm+1. Here, the first data line DL1 and the (m)th data line DLm may be included in the data lines DLa disposed on the left side or the right side of the display apparatus, and the (m+1)th data line DLm+1 may be included in the data lines DLb disposed at the center of the display apparatus.

The bypass data lines CDL may include a first bypass data line CDL1 and an (m)th bypass data line CDLm.

The first data line DL1 and the (m)th data line DLm may extend in the second direction D2 and may be disposed across the display region DA and the peripheral region NDA. That is, the first data line DL1 and the (m)th data line DLm may be positioned to correspond to the rounded corners of the display region DA and may extend in the second direction D2.

The (m+1)th data line DLm+1 may be positioned to correspond to a middle region between the rounded corners of the display region DA, may extend in the second direction D2, and may extend to the pad part PAD via the folding region FA.

The first data line DL1 and the (m)th data line DLm may be electrically connected to the first bypass data line CDL1 and the (m)th bypass data line CDLm via the first contact hole CNT1 and the (m)th contact hole CNTm, respectively in the peripheral region NDA. The first contact hole CNT1 and the (m)th contact hole CNTm may be formed through a first via insulating layer (e.g., see 140 of FIG. 4).

Here, each of the first bypass data line CDL1 and the (m)th bypass data line CDLm may include a horizontal part extending in the first direction D1 and a vertical part extending in the second direction D2.

Accordingly, a spider line conventionally connected to a data line may not be formed in the peripheral region NDA (i.e., the non-display region) adjacent to the rounded corners. Instead, the bypass data line CDL may be formed to pass through the display region DA, such that the width of the non-display region adjacent to the rounded corners may be minimized (or reduced).

In this embodiment, although it has been described that the display apparatus is a flexible display apparatus of which at least a portion can be bent by including a flexible base substrate, the present inventive concept is not limited thereto. For example, a connection structure between the data line, the bypass line, and the contact hole for reducing the width of the peripheral region of the disclosure may also be applied to a general rigid type organic light emitting display apparatus, a general rigid type liquid crystal display apparatus, and the like.

Figure 3:
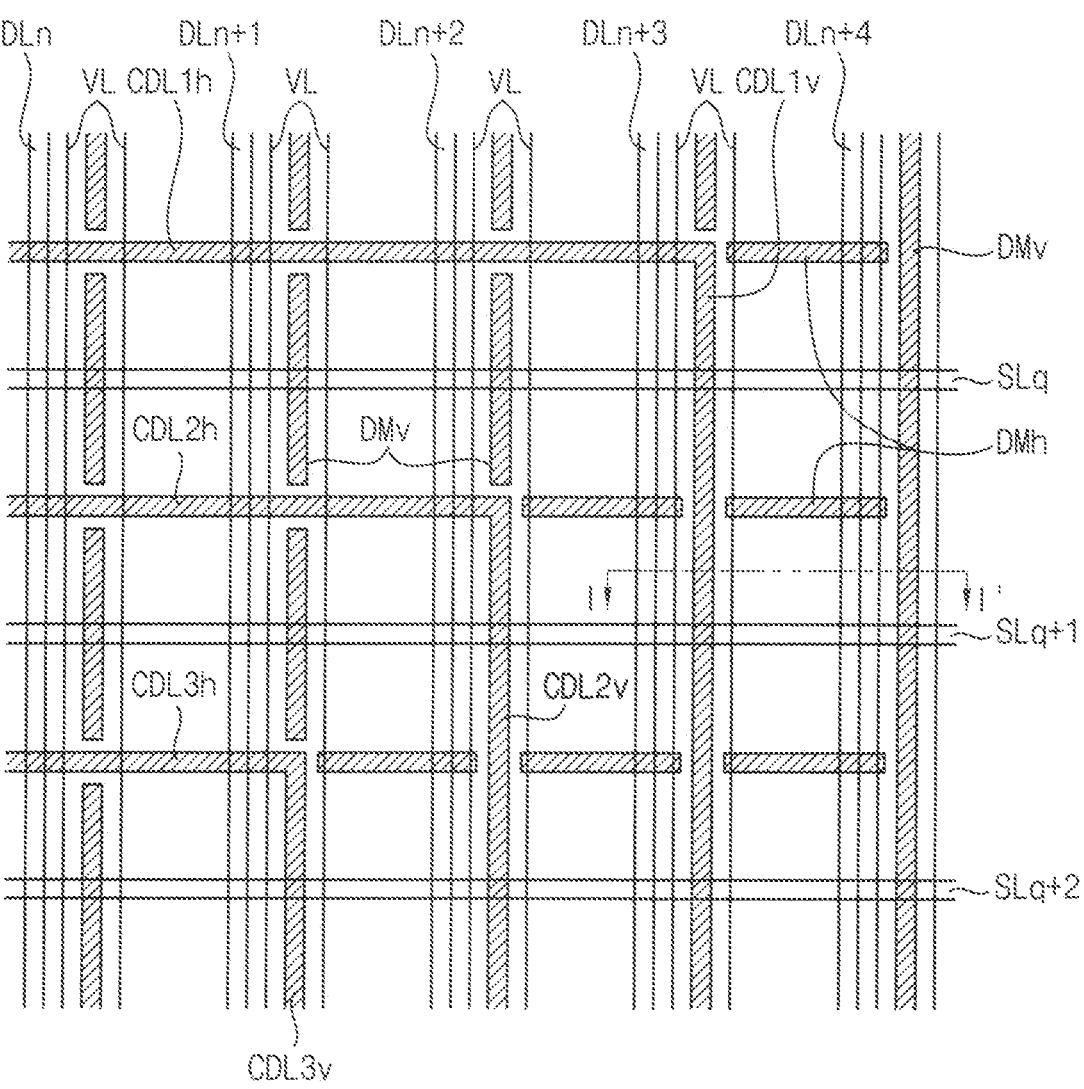
FIG. 3 is a plan view illustrating an arrangement of signal lines of an A region in FIG. 1.
Figure 3:
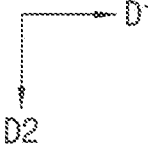
Figure 4:
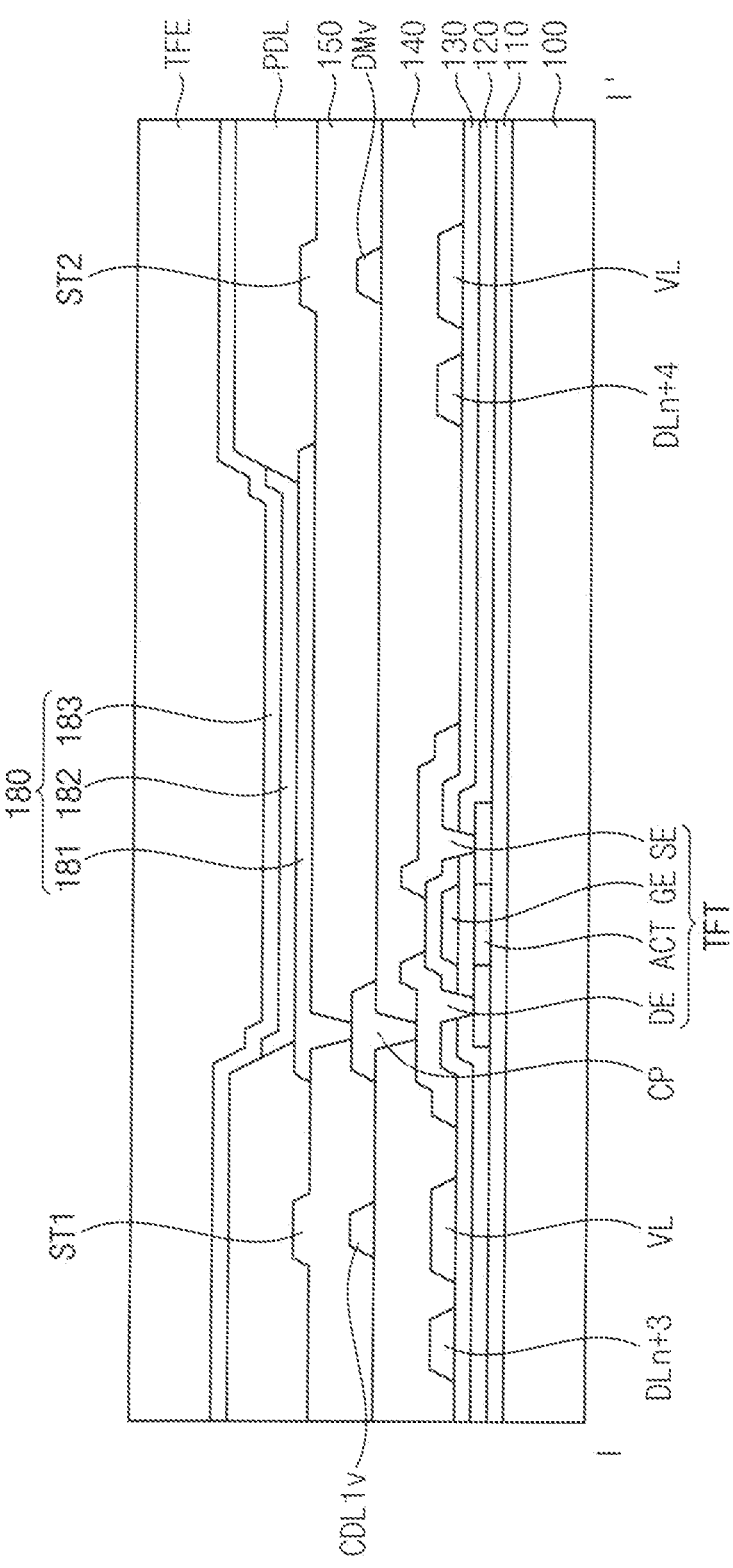
FIG. 4 is a cross-sectional view of a display apparatus taken along a line I-T in FIG. 3.

FIG. 3 is a plan view illustrating an arrangement of signal lines of an A region in FIG. 1, and FIG. 4 is a cross-sectional view of a display apparatus taken along a line I-I' in FIG. 3.

Referring to FIGS. 1 and 3 to 6, the display apparatus may include a base substrate 100, a buffer layer 110, an active pattern ACT, a gate insulating layer 120, a gate pattern, an interlayer insulating layer 130, a first source/drain pattern, a first via insulating layer 140, a second source/drain pattern, a second via insulating layer 150, a light emitting structure 180, a pixel defining layer (PDL), and a thin film encapsulation layer (TFE).

The base substrate 100 may include a transparent material or a non-transparent (i.e., opaque) material. For example, the base substrate 100 may include a quartz substrate, a synthetic quartz substrate, a calcium fluoride substrate, a fluorine-doped quartz substrate, a sodalime glass substrate, an alkali-free (i.e., non-alkali) glass substrates, and the like. Optionally, the base substrate 100 may be formed of a flexible transparent resin substrate. An example of the transparent resin substrate that can be used as the base substrate 100 may be a polyimide substrate. In this case, the polyimide substrate may include a first polyimide layer, a barrier film layer, a second polyimide layer, and the like. For example, the polyimide substrate may have a structure in which the first polyimide layer, the barrier film layer, and the second polyimide layer are stacked on a rigid glass substrate.

The buffer layer 110 may prevent diffusion of metal atoms or impurities from the base substrate 100. The buffer layer 110 may control a heat transfer velocity during a crystallization process for forming the active pattern ACT, such that a substantially uniform active pattern ACT may be obtained. In addition, when a surface of the base substrate 100 is not uniform, the buffer layer 110 may serve to improve a flatness of the surface of the base substrate 100. The buffer layer 110 may be formed using a silicon compound such as silicon oxide (SiOx), silicon nitride (SiNx), silicon oxynitride (SiOxNy), silicon oxycarbide (SiOxCy), silicon carbonitride (SiCxNy), and the like. The active pattern ACT may be disposed on the buffer layer 110. The active pattern ACT may include amorphous silicon or polycrystalline silicon. In another embodiment, the active pattern ACT may include an oxide semiconductor of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), and zinc (Zn).

The active pattern ACT may be disposed in the display region DA to be included in a thin film transistor TFT forming a pixel structure. The active pattern ACT may include a drain region and a source region doped with impurities and a channel region between the drain region and the source region.

The gate insulating layer 120 may be disposed on the active pattern ACT. The gate insulating layer 120 may include an inorganic insulating material. For example, the gate insulating layer 120 may be formed using a silicon compound such as silicon oxide (SiOx), silicon nitride (SiNx), silicon oxynitride (SiOxNy), silicon oxycarbide (SiOxCy), silicon carbonitride (SiCxNy), and the like.

The gate pattern may be disposed on the gate insulating layer 120. The gate pattern may include a gate electrode GE of the thin film transistor TFT and a signal line such as a scan line and the like. The scan line may include the (q)th scan line SLq, the (q+1)th scan line SLq+1, and the (q+2)th scan line SLq+2. The (q)th scan line SLq, the (q+1)th scan line SLq+1, and the (q+2)th scan line SLq+2 may extend in the first direction D1 and may be sequentially arranged along the second direction D2. The gate pattern may be formed using a metal, an alloy, a metal nitride, a conductive metal oxide, a transparent conductive material, and the like. For example, the gate pattern may include a metal such as copper or aluminum having high conductivity.

The interlayer insulating layer 130 may be disposed on the gate insulating layer 120 on which the gate pattern is disposed. The interlayer insulating layer 130 may include an inorganic insulating material. For example, the interlayer insulating layer 130 may be formed using a silicon compound such as silicon oxide (SiOx), silicon nitride (SiNx), silicon oxynitride (SiOxNy), silicon oxycarbide (SiOxCy), silicon carbonitride (SiCxNy), and the like.

The first source/drain pattern may be disposed on the interlayer insulating layer 130. The first source/drain pattern may include a source electrode SE, a drain electrode DE, a data line, and a power line VL.

The source electrode SE and the drain electrode DE may be electrically connected to the source region and the drain region of the active pattern ACT, respectively via contact holes that are formed through the interlayer insulating layer 130 and the gate insulating layer 120.

The data lines may include an (n)th data line DLn, an (n+1)th data line DLn+1, an (n+2)th data line DLn+2, an (n+3)th data line DLn+3, and an (n+4)th data line DLn+4. The (n)th data line DLn, the (n+1)th data line DLn+1, the (n+2)th data line DLn+2, the (n+3)th data lines DLn+3, and the (n+4)th data lines DLn+4 may extend in the second direction D2 and may be sequentially arranged along the first direction D1.

The power line VL may be plural. Each power line VL may be disposed between two adjacent data lines. The power line VL may be disposed in parallel to the data line. A first power voltage ELVDD for driving the light emitting structure 180, which is an organic light emitting element, may be applied to the power line VL.

The first source/drain pattern may be formed using a metal, an alloy, a metal nitride, a conductive metal oxide, a transparent conductive material, and the like. For example, the first source/drain pattern may include a metal such as copper or aluminum having high conductivity. In addition, the first source/drain pattern may have a multi-layered structure. For example, the first source/drain pattern may include a titanium layer, an aluminum layer on the titanium layer, and a titanium layer on the aluminum layer.

The pixels may be formed at points where the scan lines cross the data lines. Each pixel may include the thin film transistor (TFT) and the light emitting structure 180. For convenience of description, the thin film transistor (TFT) and the light emitting structure 180 for one pixel (i.e., a crossing point between DLn+3 and SLq+1) have been illustrated and described in detail with reference to FIG. 4. Thus, it should be understood that each pixel includes the thin film transistor (TFT) and the light emitting structure 180.

The first via insulating layer 140 may be disposed on the interlayer insulating layer 130 on which the first source/drain pattern is disposed. The first via insulating layer 140 may include an organic insulating material. For example, the first via insulating layer 140 may be formed using a photoresist, a polyacrylic resin, a polyimide resin, an acrylic resin, and the like.

The second source/drain pattern may be disposed on the first via insulating layer 140. The second source/drain pattern may include the bypass data line, the dummy pattern, and the contact pad CP. The second source/drain pattern may be formed using a metal, an alloy, a metal nitride, a conductive metal oxide, a transparent conductive material, and the like. For example, the second source/drain pattern may include a metal such as copper or aluminum having high conductivity. In addition, the second source/drain pattern may have a multi-layered structure. For example, the second source/drain pattern may include a titanium layer, an aluminum layer on the titanium layer, and a titanium layer on the aluminum layer.

The bypass data line may include a first bypass data line CDL1, a second bypass data line, and a third bypass data line. The first bypass data line CDL1 may include a horizontal part CDL1h extending in the first direction D1 and a vertical part CDL1v extending in the second direction D2 and connected to the horizontal part CDL1h. The vertical part CDL1v may be disposed to overlap the power line VL. Similarly, the second bypass data line may include a horizontal part CDL2h and a vertical part CDL2v, and the third bypass data line may include a horizontal part CDL3h and a vertical part CDL3v. That is, the vertical parts CDL1v, CDL2v, and CDL3v may be disposed to overlap corresponding power lines VL, respectively.

The vertical part CDL3v of the third bypass data line, the vertical part CDL2v of the second bypass data line, and the vertical part CDL1v of the first bypass data line may be sequentially arranged along the first direction D1. The horizontal part CDL1h of the first bypass data line, the horizontal part CDL2h of the second bypass data line, and the horizontal part CDL3h of the third bypass data line may be sequentially arranged along the second direction D2.

The dummy pattern may include a plurality of horizontal dummy parts DMh and a plurality of vertical dummy parts DMv.

Each of the horizontal dummy parts DMh may extend in the first direction D1. Each of the horizontal dummy parts DMh may be disposed between vertical parts of two adjacent bypass data lines (or between an adjacent horizontal dummy part DMh and a vertical part of an adjacent bypass data line) in a region where the bypass data line is disposed. For example, the horizontal dummy part DMh between the (q)th scan line SLq and the (q+1)th scan line SLq+1 may be disposed in a straight line with the horizontal part CDL2h of the second bypass data line.

Each of the vertical dummy parts DMv may extend in the second direction D2. Each of the vertical dummy parts DMv may be disposed between horizontal parts of two adjacent bypass data lines in a region where the bypass data line is disposed. For example, the vertical dummy part DMv between the (n+2)th data line DLn+2 and the (n+3)th data line DLn+3 may be disposed in a straight line with the vertical part CDL2v of the second bypass data line.

A constant voltage may be applied to the dummy pattern to have a shielding effect. For example, the dummy pattern may be electrically connected to the power line VL via a contact hole (not shown) formed through the first via insulating layer 140.

The contact pad CP may be electrically connected to the drain electrode DE of the thin film transistor TFT via the contact hole formed through the first via insulating layer 140.

The second via insulating layer 150 may be disposed on the first via insulating layer 140 on which the second source/drain pattern is disposed. The second via insulating layer 150 may include an organic insulating material. For example, the second via insulating layer 150 may be formed using a photoresist, a polyacrylic resin, a polyimide resin, an acrylic resin, and the like.

Step differences ST1 and ST2 corresponding to the dummy pattern and the bypass data line may be formed on an upper surface of the second via insulating layer 150. When the thickness of the second via insulating layer 150 is sufficient, a step difference may not be formed on the upper surface of the second via insulating layer 150 and thus may be flat. However, when the second source/drain pattern is sufficiently thick and when the thickness of the second via insulating layer 150 is thin, the step differences ST1 and ST2 corresponding to the dummy pattern and the bypass data line may be formed on the upper surface of the second via insulating layer 150.

The step differences ST1 and ST2 may be formed along the bypass data line forming a specific pattern, and thus the step differences ST1 and ST2 may be visually recognized by a user (or viewer) as a stain pattern in a final product state. However, in the present disclosure, because the dummy pattern having the same shape as the bypass data line is formed in a region where the bypass data line is not formed, deviation in the stain pattern may be reduced so that the user may not perceive the stain pattern. That is, the second via insulating layer 150 may be formed using an organic insulating material and minimizing the thickness of the second via insulating layer 150, a stain problem due to the step differences ST1 and ST2 may be solved without performing a separate planarization processing on the second via insulating layer 150.

The light emitting structure 180 may include a first electrode 181, a light emitting layer 182, and a second electrode 183.

The first electrode 181 may be disposed on the second via insulating layer 150. Depending on a light emitting method of the display apparatus, the first electrode 181 may be formed using a reflective material or a light transmissive material. In some embodiments, the first electrode 181 may have a single-layered structure or a multi-layered structure including a metal film, an alloy film, a metal nitride film, a conductive metal oxide film, and/or a transparent conductive material film.

The pixel defining layer PDL may be disposed on the second via insulating layer 150 on which the first electrode 181 is disposed. The pixel defining layer PDL may be formed using an organic material, an inorganic material, and the like. For example, the pixel defining layer PDL may be formed using a photoresist, a polyacrylic resin, a polyimide resin, an acrylic resin, a silicone compound, and the like. According to embodiments, the pixel defining layer PDL may be etched to form an opening partially exposing the first electrode 181. An emission region and a non-emission region of the display apparatus may be defined by the opening of the pixel defining layer PDL. For example, a region in which the opening of the pixel definition layer PDL is located may correspond to the emission region, and the non-emission region may correspond to a region adjacent to the opening of the pixel definition layer PDL.

The light emitting layer 182 may be disposed on the first electrode 181 exposed through the opening of the pixel defining layer PDL. In addition, the light emitting layer 182 may extend onto a sidewall of the opening of the pixel defining layer PDL. In an embodiment, the light emitting layer 182 may have a multi-layered structure including an organic emission layer, a hole injection layer, a hole transport layer, an electron transport layer, an electron injection layer, and the like. In another embodiment, except for the organic emission layer, the hole injection layer, the hole transport layer, the electron transport layer, the electron injection layer, and the like may be commonly formed to correspond to a plurality of pixels. The organic emission layer of the light emitting layer 182 may be formed using light emitting materials capable of generating different color lights such as red light, green light, and blue light according to respective pixels of the display apparatus. In some embodiments, the organic emission layer of the light emitting layer 182 may have a structure in which a plurality of light emitting materials capable of generating (or implementing) different color lights such as red light, green light, blue light, and the like are stacked to emit white light. Here, the light emitting structures may be commonly formed to correspond to a plurality of pixels, and each of the pixels may be divided by a color filter layer.

The second electrode 183 may be disposed on the pixel defining layer PDL and the light emitting layer 182. Depending on the light emitting method of the display apparatus, the second electrode 183 may include a light transmissive material or a reflective material. In some embodiments, the second electrode 183 may also have a single-layered structure or a multi-layered structure including a metal film, an alloy film, a metal nitride film, a conductive metal oxide film, and/or a transparent conductive material film.

The thin film encapsulation layer TFE may be disposed on the second electrode 183. The thin film encapsulation layer TFE may prevent penetration of moisture and oxygen from the outside. The thin film encapsulation layer TFE may include at least one organic layer and at least one inorganic layer. At least one organic layer and at least one inorganic layer may be alternately stacked with each other. For example, the thin film encapsulation layer TFE may include two inorganic layers and one organic layer therebetween. However, a structure of the thin film encapsulation layer TFE is not limited thereto. In some embodiments, instead of the thin film encapsulation layer TFE, a sealing substrate may be provided to block (or prevent) the penetration of external air and moisture into the display apparatus.

Figure 5:
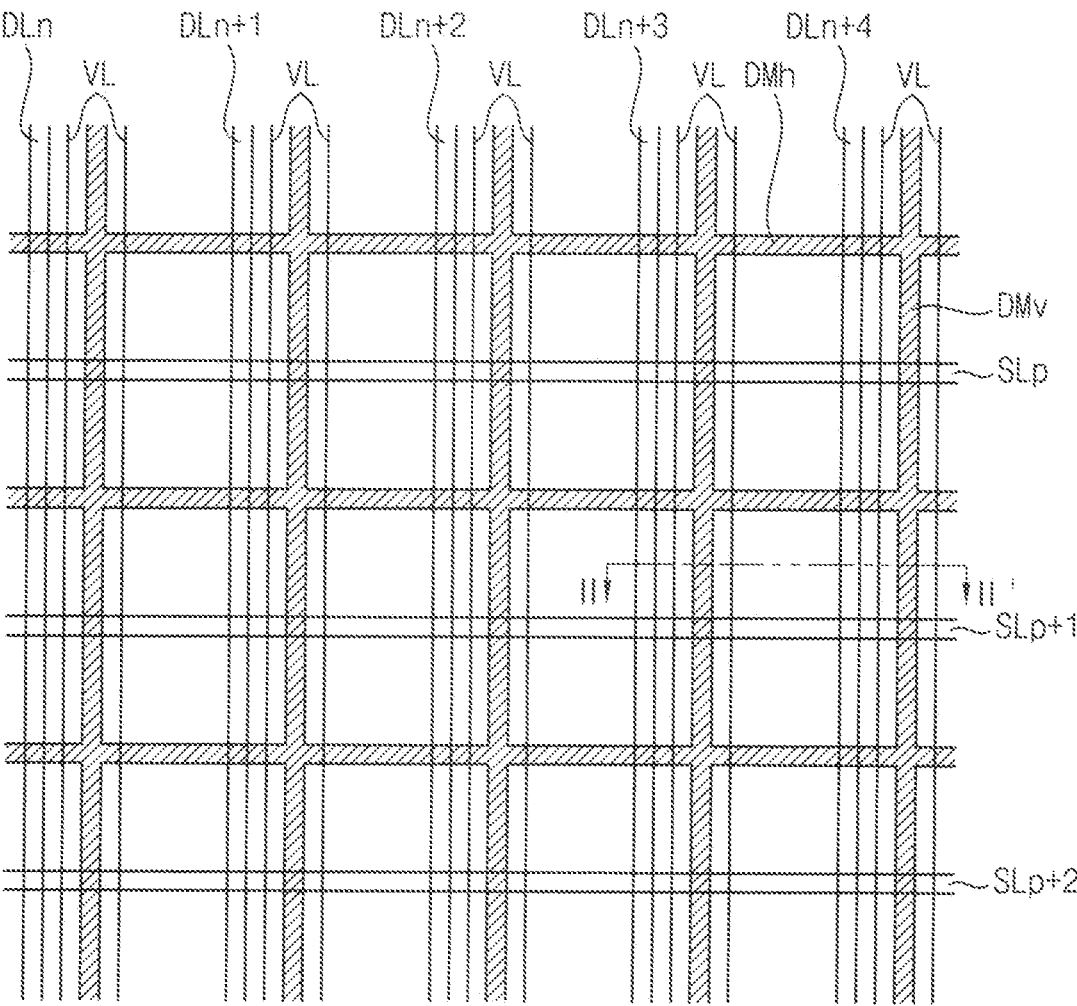
FIG. 5 is a plan view illustrating an arrangement of signal lines of a B region in FIG. 1.
Figure 5:
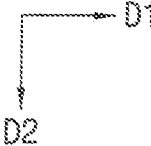
Figure 6:
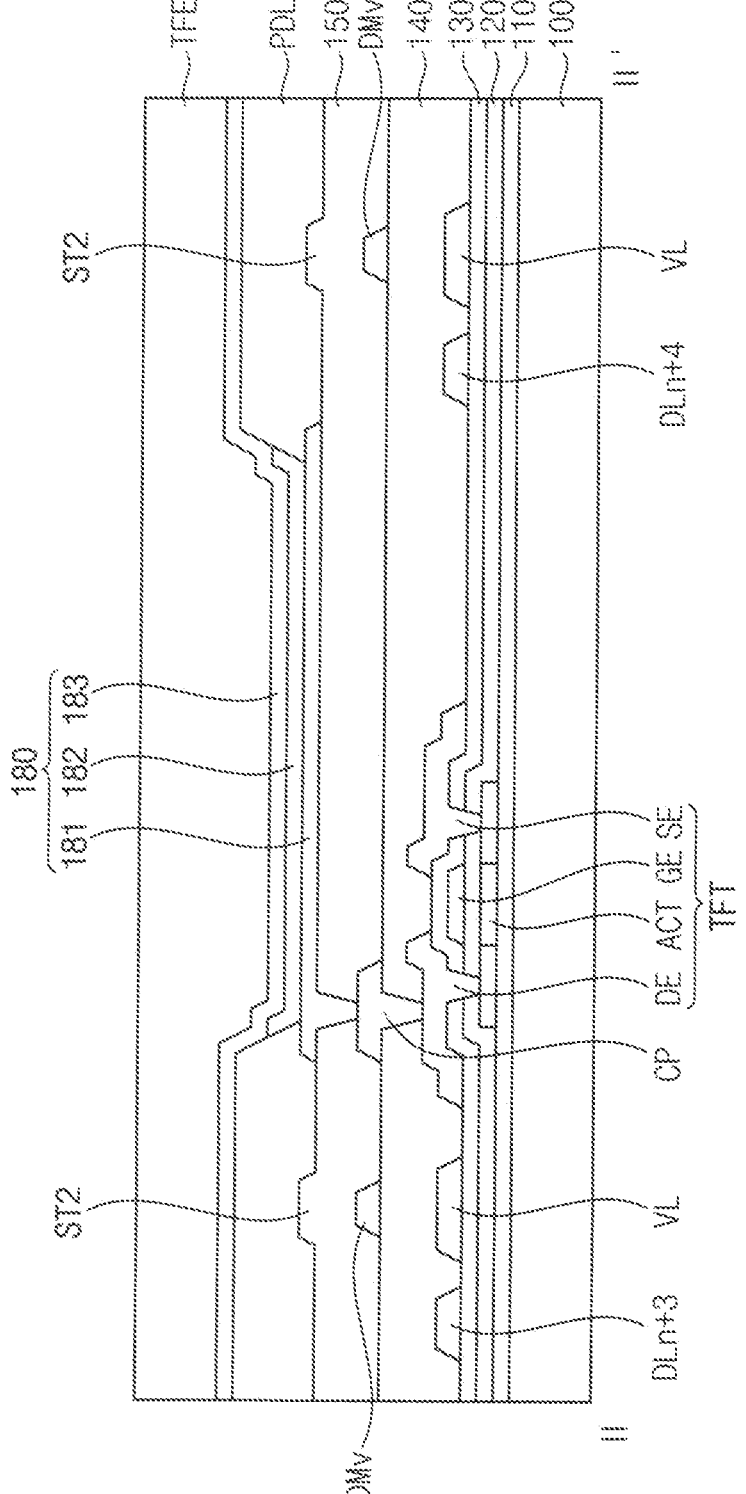
FIG. 6 is a cross-sectional view of a display apparatus taken along a line II-IT' in FIG. 5.

FIG. 5 is a plan view illustrating an arrangement of signal lines of a B region in FIG. 1, and FIG. 6 is a cross-sectional view of a display apparatus taken along a line II-IT' in FIG. 5.

Referring to FIGS. 1 to 6, except that the bypass data line is not formed and the dummy pattern forms a mesh structure, a structure of the B region of the display apparatus is the same as a structure of the A region (see FIGS. 4 and 5) of the display apparatus. Thus, duplicated description will not be repeated.

The dummy pattern may be formed to form the mesh structure in a region where the bypass data line is not formed. The dummy pattern may extend along the first direction D1. The dummy pattern may include a plurality of horizontal dummy parts DMh that are arranged along the second direction D2 and a plurality of vertical dummy parts DMv that cross the horizontal dummy parts DMh, extend along the second direction D2, and are arranged along the first direction D1. The vertical dummy part DMv of the dummy pattern may be disposed to overlap a corresponding power line VL. A first power ELVDD may be applied to the vertical dummy part DMv of the dummy pattern.

In FIG. 5, a region where a (p)th scan line SLp, a (p+1)th scan line SLp+1, and a (p+2)th scan line SLp+2 cross an (n)th data line DLn, an (n+1)th data line DLn+1, an (n+2)th data line DLn+2, an (n+3)th data line DLn+3, and an (n+4)th data line DLn+4 is illustrated. That is, in FIGS. 3 and 4, a region where the bypass data line is disposed is described, and in FIGS. 5 and 6, an arrangement of the dummy pattern in a region where the bypass data line is not disposed is described.

Figure 7:
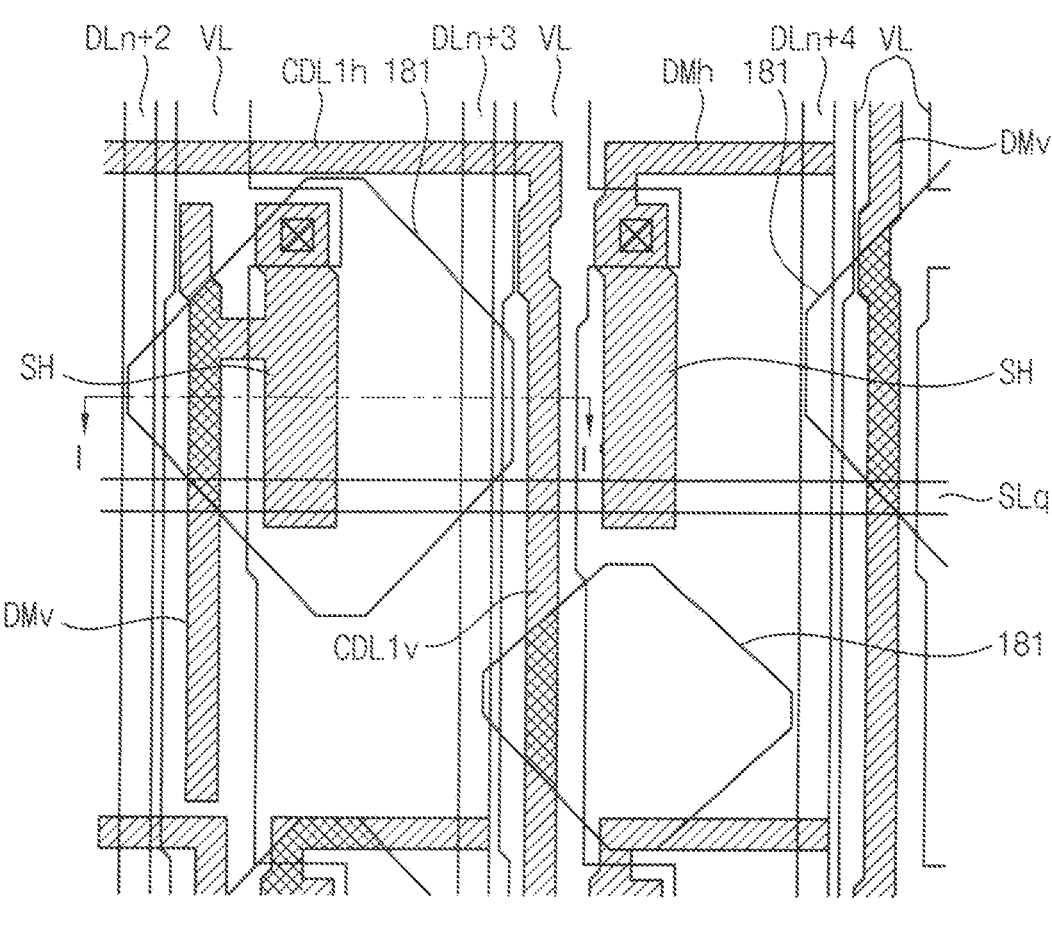
FIG. 7 is a plan view illustrating an arrangement of signal lines in a portion of a display apparatus according to embodiments.
Figure 7:
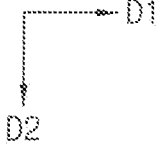
Figure 8:
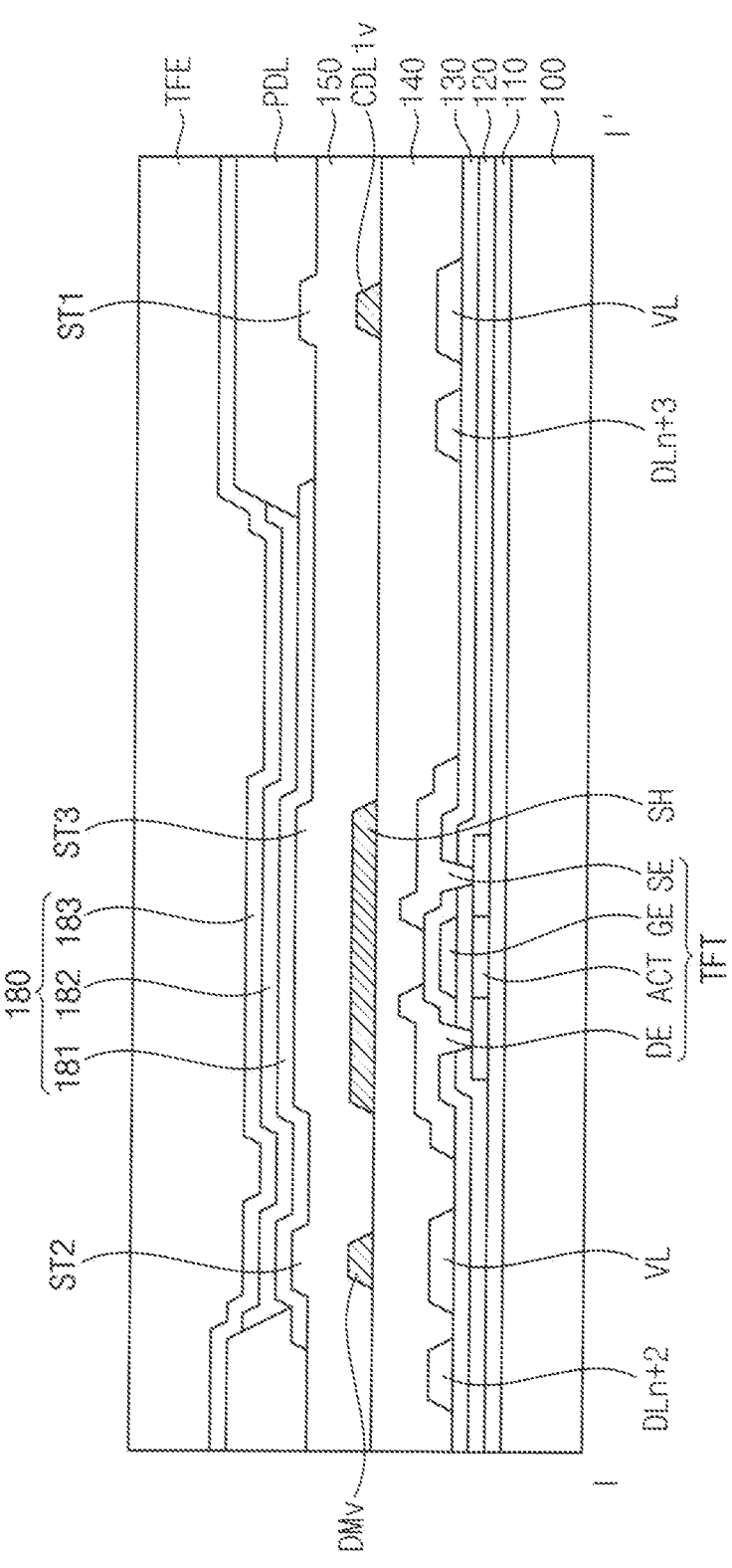
FIG. 8 is a cross-sectional view of a display apparatus taken along a line I-I' in FIG. 7.
Figure 9:
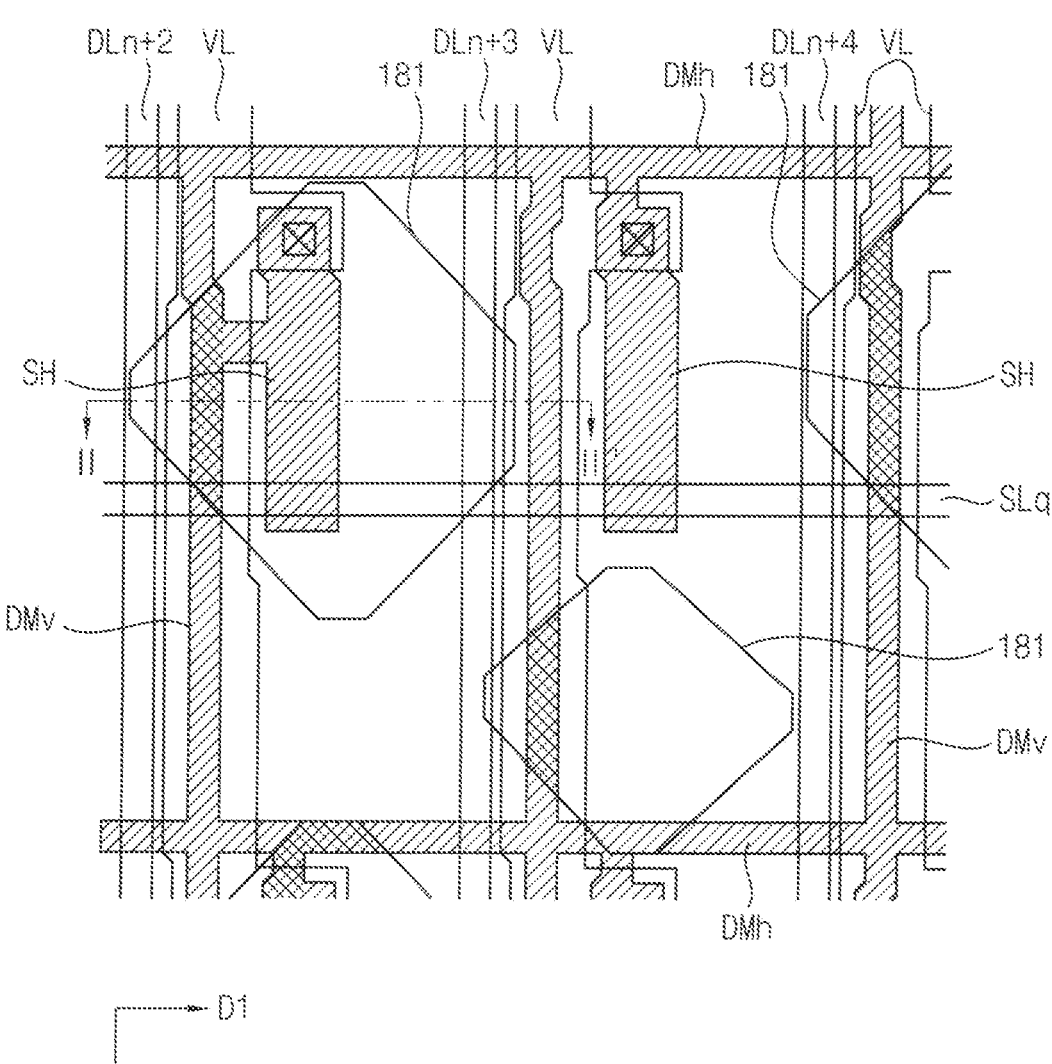
FIG. 9 is a plan view illustrating an arrangement of signal lines in another portion of the display apparatus of FIG. 7.
Figure 10:
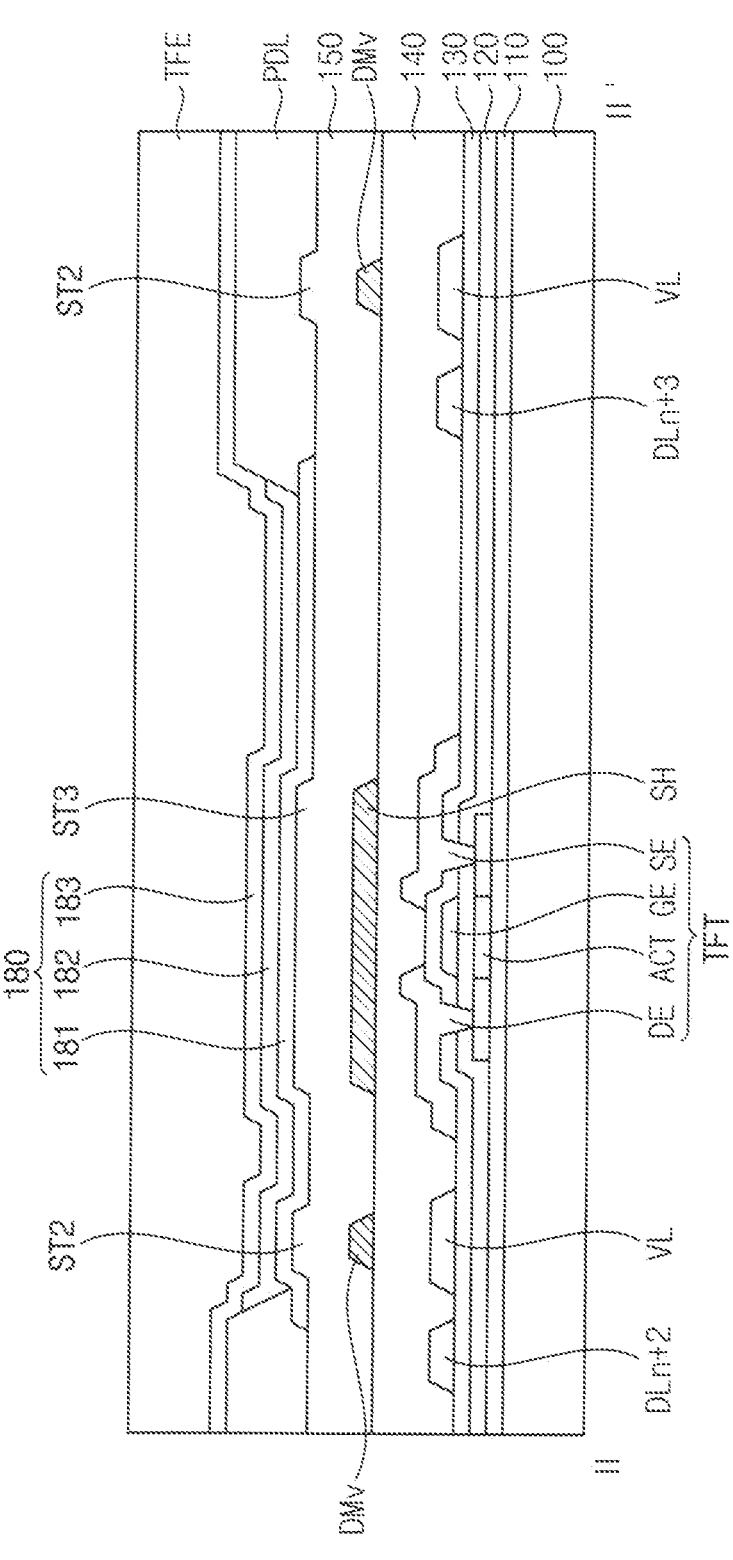
FIG. 10 is a cross-sectional view of a display apparatus taken along a line II-II' in FIG. 9.

FIG. 7 is a plan view illustrating an arrangement of signal lines in a portion of a display apparatus according to embodiments, FIG. 8 is a cross-sectional view of a display apparatus taken along a line I-I' in FIG. 7, FIG. 9 is a plan view illustrating an arrangement of signal lines in another portion of the display apparatus of FIG. 7, and FIG. 10 is a cross-sectional view of a display apparatus taken along a line II-IT' in FIG. 9.

Referring to FIGS. 1 and 7 to 10, except that a shielding electrode SH and a shape of the first electrode 181, the display apparatus is substantially the same as the display apparatus of FIGS. 1 to 6. Thus, duplicated description will not be repeated.

The display apparatus may include a base substrate 100, a buffer layer 110, an active pattern ACT, a gate insulating layer 120, a gate pattern, an interlayer insulating layer 130, a first source/drain pattern, a first via insulating layer 140, a second source/drain pattern, a second via insulating layer 150, a light emitting structure 180, a pixel defining layer PDL, and a thin film encapsulation layer TFE. The light emitting structure 180 may include a first electrode 181, a light emitting layer 182, and a second electrode 183.

The gate pattern may include a gate electrode GE. The first source/drain pattern may include a source electrode SE, a drain electrode DE, a power line VL, an (n+2)th data line DLn+2, an (n+3)th data line DLn+3, and an (n+4)th data line DLn+4. The second source/drain pattern may include a first bypass data line, a dummy pattern, and a shielding electrode SH. The first bypass data line may include a horizontal part CDL1$h$ and a vertical part CDL1$v$. The dummy pattern may include a plurality of horizontal dummy parts DMh and a plurality of vertical dummy parts DMv.

The shielding electrode SH may be disposed to overlap the thin film transistor TFT of each pixel, such that the shielding electrode SH may shield the thin film transistor TFT from external electromagnetic influences. The shielding electrode SH may be physically connected to the horizontal dummy part DMh or the vertical dummy part DMh. The shielding electrode SH may be electrically connected to the power line VL via a contact hole that is formed through the first via insulating layer 140.

Step differences ST1, ST2, and ST3 may be formed on an upper surface of the first via insulating layer 140 on the vertical part CDL1$v$ of the first bypass data line, the vertical dummy part DMv, and the shielding electrode SH.

The first electrode 181 may be disposed for at least a portion of the first electrode 181 to overlap the dummy pattern or the bypass data line, so that a step difference corresponding to the step difference may be formed in the first electrode 181 as well. Particularly, when the first electrode 181 includes a reflective material, particularly, silver (Ag), a stain pattern due to the step difference may be visually recognized by a user. However, because the step difference is uniformly repeated on an entire display region DA by the dummy pattern, deviation in the stain pattern may be reduced, and thus the user may not perceive the stain pattern as a stain.

Figure 11:
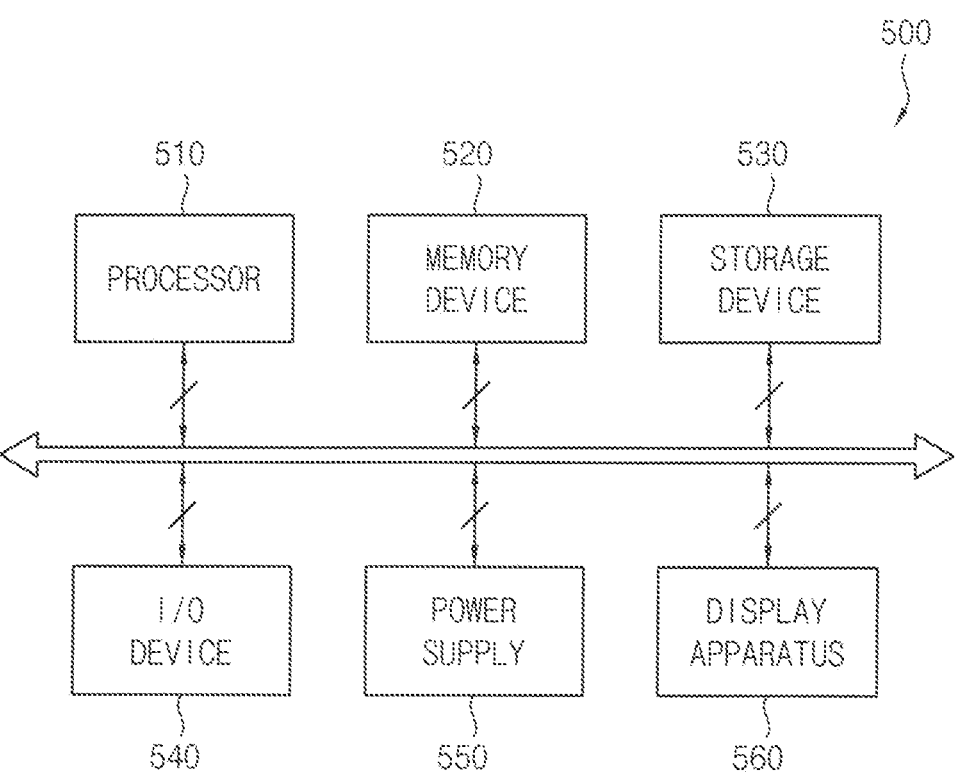
FIG. 11 is a block diagram illustrating an electronic device according to embodiments.
Figure 12A:
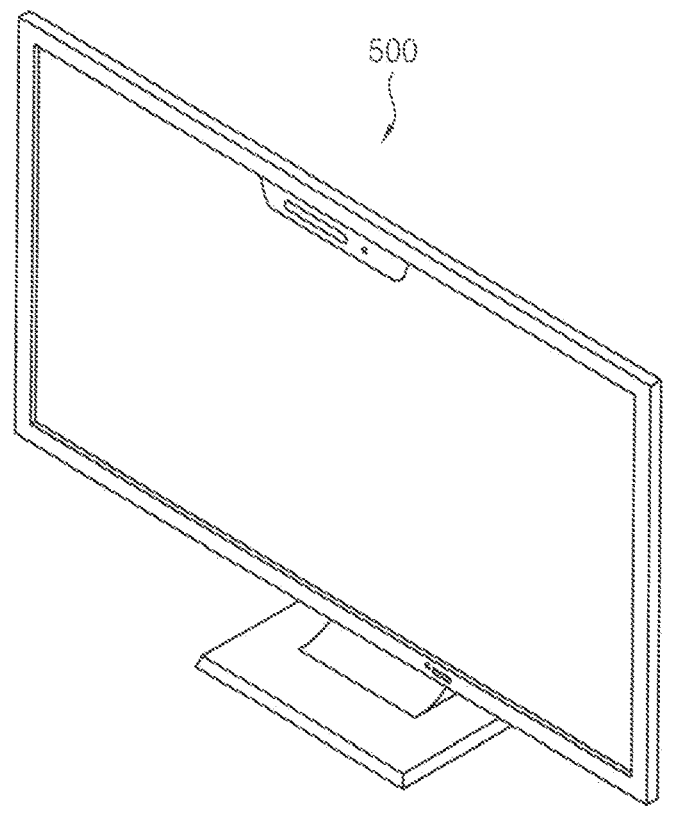
FIG. 12A is a diagram illustrating an example in which the electronic device of FIG. 11 is implemented as a television.
Figure 12B:
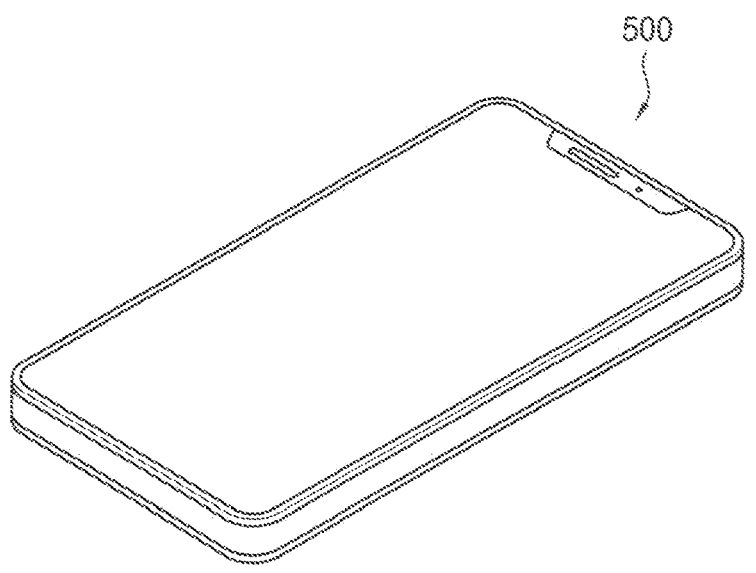
FIG. 12B is a diagram illustrating an example in which the electronic device of FIG. 11 is implemented as a smart phone.

FIG. 11 is a block diagram illustrating an electronic device according to embodiments, FIG. 12A is a diagram illustrating an example in which the electronic device of FIG. 11 is implemented as a television, and FIG. 12B is a diagram illustrating an example in which the electronic device of FIG. 11 is implemented as a smart phone.

Referring to FIGS. 11 to 12B, the electronic device 500 may include a processor 510, a memory device 520, a storage device 530, an input/output (I/O) device 540, a power supply 550, and a display apparatus 560. Here, the display apparatus 560 may be the display apparatus of FIG. 1. In addition, the electronic device 500 may further include a plurality of ports for communicating with a video card, a sound card, a memory card, a universal serial bus (USB) device, other electronic devices, and the like. In an embodiment, as illustrated in FIG. 12A, the electronic device 500 may be implemented as a television. In another embodiment, as illustrated in FIG. 12B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD) apparatus, and the like.

The processor 510 may perform various computing functions. The processor 510 may be a micro-processor, a central processing unit (CPU), an application processor (AP), and the like. The processor 510 may be coupled to other components via an address bus, a control bus, a data bus, and the like. Further, the processor 510 may be coupled to an extended bus such as a peripheral component interconnection (PCI) bus. The memory device 520 may store data for operations of the electronic device 500. For example, the memory device 520 may include a non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or a volatile memory device such as a dynamic random access memory (DRAM) device, a static random access memory (SRAM) device, a mobile DRAM device, and the like. The storage device 530 may include a solid state drive (SSD) device, a hard disk drive (HDD) device, a CD-ROM device, and the like. The I/O device 540 may include an input device such as a keyboard, a keypad, a mouse device, a touch-pad, a touch-screen, and the like and an output device such as a printer, a speaker, and the like. The power supply 550 may provide power for operations of the electronic device 500.

The display apparatus 560 may be coupled to other components via the buses or other communication links. In some embodiments, the display apparatus 560 may be included in the I/O device 540. As described above, the display apparatus 560 may reduce a peripheral region, which is a non-display region, by including a bypass data line and may prevent a user from recognizing a stain due to the bypass data line by forming a dummy pattern corresponding to the bypass data line on a display region (i.e., by reducing deviation in a stain pattern). That is, the display apparatus 560 may solve a stain problem without performing a separate planarization processing on a second via insulating layer while forming the second via insulating layer using an organic insulating material and minimizing a thickness of the second via insulating layer. Since these are described above, duplicated description related thereto will not be repeated.

According to embodiments of the present disclosure, the display apparatus may reduce a peripheral region, which is a non-display region, by including the bypass data line and may prevent a user from recognizing a stain due to the bypass data line by forming a dummy pattern corresponding to the bypass data line on a display region (i.e., by reducing deviation in a stain pattern). That is, the display apparatus may solve a stain problem without performing a separate planarization processing on a second via insulating layer while forming the second via insulating layer using an organic insulating material and minimizing a thickness of the second via insulating layer.

However, effects of the present inventive concept are not limited to the above effects, and may be extended without departing from the spirit and scope of the present disclosure.

The inventive concept may be applied to an organic light emitting display apparatus and an electronic device including the organic light emitting display apparatus. For example, the present inventive concept may be applied to a cellular phone, a smart phone, a video phone, a smart pad, a smart watch, a tablet PC, a car navigation system, a television, a computer monitor, a laptop, a head mounted display (HMD) apparatus, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present disclosure. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

The invention claimed is:

1. A display apparatus which includes a display region and a peripheral region that is a non-display region surrounding the display region, the display apparatus comprising:
a plurality of data lines disposed in the display region and extending to the peripheral region;
a bypass data line disposed in the display region and the peripheral region and electrically connected to at least one of the data lines; and
a dummy pattern spaced apart from the bypass data line, disposed to form a mesh structure with the bypass data line in a region where the bypass data line is disposed, and disposed to form the mesh structure alone in a region where the bypass data line is not disposed.

2. The display apparatus of claim 1, wherein a constant voltage is applied to the dummy pattern.

3. The display apparatus of claim 2, further comprising:
a first via insulating layer disposed between the data line and the bypass data line;
a second via insulating layer disposed on the first via insulating layer on which the bypass data line and the dummy pattern are disposed;
a first electrode disposed on the second via insulating layer;
a light emitting layer disposed on the first electrode; and
a second electrode disposed on the light emitting layer.

4. The display apparatus of claim 3, wherein the second via insulating layer includes an organic insulating material.

5. The display apparatus of claim 4, wherein a step difference corresponding to the dummy pattern and the bypass data line is formed on an upper surface of the second via insulating layer on the dummy pattern and the bypass data line.

6. The display apparatus of claim 5, wherein at least a portion of the first electrode overlaps the dummy pattern or the bypass data line, and a step difference corresponding to the step difference is formed in the first electrode.

7. The display apparatus of claim 6, wherein the first electrode includes silver (Ag).

8. The display apparatus of claim 3, further comprising:
a first power line disposed between the base substrate and the first via insulating layer, a first power voltage being applied to the first power line,
wherein the first power line is disposed to overlap the bypass data line or the dummy pattern.

9. The display apparatus of claim 3, wherein the bypass data line and the data line contact each other via a contact hole that is formed through the first via insulating layer in the peripheral region.

10. The display apparatus of claim 1, wherein the bypass data line includes a vertical part and a horizontal part connected to the vertical part,
wherein the dummy pattern includes a plurality of vertical dummy parts and a plurality of horizontal dummy parts, and
wherein at least one of the vertical dummy parts extends in the same direction as the vertical part of the bypass data line and at least one of the horizontal dummy parts extends in the same direction as the horizontal part of the bypass data line to form the mesh structure in the region where the bypass data line is disposed.

11. The display apparatus of claim 1, wherein the dummy pattern includes a plurality of vertical dummy parts and a plurality of horizontal dummy parts, and the vertical dummy part and the horizontal dummy part are connected to each other to form the mesh structure in the region where the bypass data line is not disposed.

12. The display apparatus of claim 1, wherein the display region has a quadrangle shape with rounded corners,
wherein the peripheral region includes a pad region in which a pad part is disposed,
wherein the data lines include a first data line disposed adjacent to the rounded corners and a second data line spaced apart from the first data line,
wherein the first data line is electrically connected to the pad part through the bypass data line, and
wherein the second data line is connected to the pad part without connecting to the bypass data line.

13. The display apparatus of claim 1, wherein the dummy pattern is disposed on a same layer as the bypass data line.

14. The display apparatus of claim 1, further comprising:
a shielding electrode physically connected to the dummy pattern.

15. An electronic apparatus comprising:
the display apparatus of claim 1; and
a processor configured to generate image data,
wherein the display apparatus displays an image based on the image data.

16. A display apparatus which includes a display region and a peripheral region that is a non-display region surrounding the display region, the display apparatus comprising:
a plurality of data lines disposed in the display region and extending to the peripheral region;
a bypass data line disposed in the display region and the peripheral region and electrically connected to at least one of the data lines; and
a dummy pattern spaced apart from the bypass data line and disposed on a same layer as the bypass data line,
wherein the display region has a quadrangle shape with rounded corners,
wherein the peripheral region includes a pad region in which a pad part is disposed,
wherein the data lines include a first data line disposed adjacent to the rounded corners and a second data line spaced apart from the first data line,
wherein the first data line is electrically connected to the pad part through the bypass data line, and
wherein the second data line is connected to the pad part without connecting to the bypass data line.

17. The display apparatus of claim 16, wherein a constant voltage is applied to the dummy pattern.

18. The display apparatus of claim 17, further comprising:

a first via insulating layer disposed between the data line and the bypass data line;

a second via insulating layer disposed on the first via insulating layer on which the bypass data line and the dummy pattern are disposed;

a first electrode disposed on the second via insulating layer;

a light emitting layer disposed on the first electrode;

a second electrode disposed on the light emitting layer; and a first power line disposed between the base substrate and the first via insulating layer, a first power voltage being applied to the first power line, wherein the first power line is disposed to overlap the bypass data line or the dummy pattern.

19. The display apparatus of claim 18, wherein the bypass data line and the data line contact each other via a contact hole that is formed through the first via insulating layer in the peripheral region.

20. An electronic apparatus comprising:

the display apparatus of claim 16; and a processor configured to generate image data, wherein the display apparatus displays an image based on the image data.

* * * * *